(12) United States Patent
Khouri et al.

(10) Patent No.: US 12,394,493 B2
(45) Date of Patent: Aug. 19, 2025

(54) METHOD AND SYSTEM FOR READING UNKNOWN DATA FROM NON-VOLATILE MEMORY

(71) Applicant: EM Microelectronic-Marin SA, Marin (CH)

(72) Inventors: Osama Khouri, Neuchatel (CH); Yves Godat, Cornaux (CH)

(73) Assignee: EM Microelectronic-Marin SA, Marin (CH)

( * ) Notice: Subject to any disclaimer, the term of this patent is extended or adjusted under 35 U.S.C. 154(b) by 119 days.

(21) Appl. No.: 18/360,359

(22) Filed: Jul. 27, 2023

(65) Prior Publication Data

US 2024/0145015 A1   May 2, 2024

(30) Foreign Application Priority Data

Nov. 1, 2022  (EP) .................................... 22204858

(51) Int. Cl.
  *G11C 16/28*  (2006.01)
(52) U.S. Cl.
  CPC .................................. *G11C 16/28* (2013.01)
(58) Field of Classification Search
  CPC ...................................................... G11C 16/28
  USPC ...................................................... 365/185.2
  See application file for complete search history.

(56) References Cited

U.S. PATENT DOCUMENTS

| 11,715,539 B2 * | 8/2023 | Mondello | ............... | G11C 29/42 |
| | | | | 365/185.22 |
| 2002/0118573 A1 * | 8/2002 | Pasotti | ............ | G11C 16/28 |
| | | | | 365/185.24 |
| 2013/0297986 A1 * | 11/2013 | Cohen | ................. | G06F 3/061 |
| | | | | 714/763 |
| 2015/0205527 A1 | 7/2015 | Cohen | | |
| 2016/0357631 A1 | 12/2016 | Cohen | | |

(Continued)

FOREIGN PATENT DOCUMENTS

WO    WO 2020/240231 A1   12/2020

OTHER PUBLICATIONS

Extended European Search Report issued Mar. 29, 2023 in European Application 22204858.9 filed on Nov. 1, 2022 15 therein, 9 pages (with Written Opinion).

*Primary Examiner* — Amir Zarabian
*Assistant Examiner* — Daniel J King
(74) *Attorney, Agent, or Firm* — Oblon, McClelland, Maier & Neustadt, L.L.P.

(57) ABSTRACT

A method for reading data from a non-volatile memory array having memory cells configured to store one bit information, including powering on the array, where information from at least first and second memory cells is collectively associated with one bit of sensible data; reading first and second memory cell values by comparing a reference value to an electrical property value of the respective memory cell; adjusting the reference value when at least the first and second memory cell values have a first combination of logic state values; reading the first and second memory cell values using the adjusted reference value to obtain a second combination of logic state values; and determining a sensible data bit value based on the second combination. The adjusted reference value lies in the space between first and second distributions of possible electrical property values respectively for the first and second memory cell values.

16 Claims, 4 Drawing Sheets

(56) References Cited

U.S. PATENT DOCUMENTS

2021/0407608 A1 12/2021 Mondello et al.
2023/0005555 A1 1/2023 Mondello et al.

* cited by examiner

Example:
The correct memory cells' content: "1" and "0" → "10"
The wrong memory cells' content: "1" and "1" → "11"

Example:
The correct memory cells' content: "1" and "0" → "10"
The wrong memory cells' content: "0" and "0" → "00"

METHOD AND SYSTEM FOR READING UNKNOWN DATA FROM NON-VOLATILE MEMORY

CROSS-REFERENCE TO RELATED APPLICATION

This application claims priority to European Patent Application No. 22204858.9 filed on Nov. 1, 2022, the entire disclosure of which is hereby incorporated herein by reference.

TECHNICAL FIELD

The present invention relates to a method for reading unknown data from non-volatile memory. More specifically, in the illustrated example, the method uses a set of at least two bits stored in at least two memory cells, where the bits are collectively logically associated with an unknown value of a single bit to reliably read the value of the single bit. The invention also relates to a memory device where the method may be carried out.

BACKGROUND OF THE INVENTION

Memory devices are well known in the electronic field to store digital information. In general, different kinds of semiconductor memory devices may be incorporated into more complex systems including non-volatile memory components as well as volatile memory components, for instance in so-called system-on-chips (SoC), where the memory components are embedded.

Non-volatile memory (NVM) can provide persistent data by retaining stored data when not powered and can include NAND flash memory, NOR flash memory, 3DXP memories, MRAMs, STTRAM and CBRAMs, among others. Inside NVMs data are thus stored and maintained even in the absence of power supply. Some of the data could be more sensible than other data. The sensible data should be able to be read correctly and reliably. Trimming bits are an example of sensible data, and these bits are stored in a specific area of an NVM device during testing and these bits should not be altered by the user of the memory device. Trimming bits are usually read after power-on, and they should be correct. Subsequently, these bits are stored in a buffer to be used to trim or correct all circuits which require trimming for correct functionality.

After power-on, if no particular technique is used in the design of the memory device, trimming bits (or any sensible data) stored in an NVM area may be read in a wrong way due for example to a power supply value that is different from the one given in the specification for the respective memory device.

When a reference value is used in the read operation, this reference value has a default value, which may not be optimal for the read operation at power-on. This may lead to a wrong data read-out, and consequently to wrong trimming bits, which will likely cause a malfunction of the apparatus associated with the memory device, which often is a major problem.

Some state-of-the-art techniques use a so-called majority technique to read sensible data, such as trimming bits. This technique involves the operation of storing any given trimming bit in at least three memory cells (or in any odd number of memory cells greater than three). Thus, the same bit content "1" or "0" is stored in at least three different memory cells. The read operation is performed in all these memory cells and the most frequent reading result defines the trimming bit content.

Another technique is to write trimming bits with an error correction code (ECC) and when these bits are read, the ECC will correct the data. However, both of the above techniques increase the required memory area and complexity of the memory device.

WO2020240231A1 discloses yet another technique for reading data from an NVM device. However, the disclosed technique is not suitable for reading unknown data.

SUMMARY OF THE INVENTION

An object of the present invention is to overcome at least some of the above shortcomings relating to reading data, and in particular sensible data, from non-volatile memory.

According to a first aspect of the invention, there is provided a method for reading data from a non-volatile memory array as recited in claim 1.

The advantage of the proposed solution is that the reading result of unknown data will be correct and reliable. The proposed method can thus be considered as a data correction method without using an ECC, although it could also be used in connection with an ECC. The proposed solution may be applied wherever sensible data stored in an NVM device must be read reliably. The proposed solution could be used to read unknown important data after power-on or during the lifetime of the memory device where aging and retention of data may compromise data integrity.

Advantageously, the read operation of sensible data may be executed when the power is on, and not to be executed only after power-on.

According to a second aspect of the invention, there is provided a memory system for reading data from a non-volatile memory array as recited in claim 15.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF THE INVENTION

Figure 1:
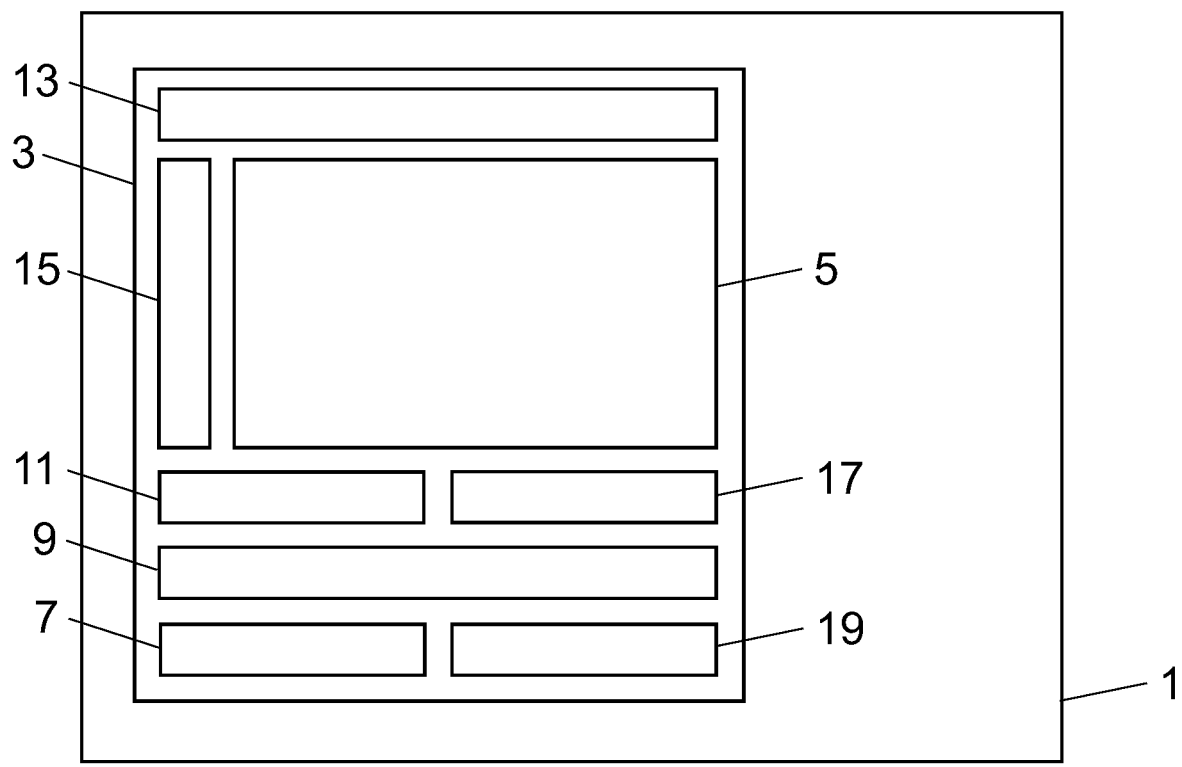
FIG. 1 is a block diagram showing an example memory system where the teachings of the present invention can be implemented.

An embodiment of the present invention will now be described in detail with reference to the attached figures. Identical or corresponding functional and structural elements which appear in different drawings are assigned the same reference numerals. As utilised herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." Furthermore, the term "comprise" is used herein as an open-ended term. This means that the object encompasses all the elements listed, but may also include additional, unnamed elements. Thus, the word "comprise" is interpreted by the broader meaning "include", "contain" or "comprehend".

FIG. 1 schematically illustrates an example memory system 1 incorporating an NVM device or component 3. The system may also include a memory controller (not illustrated) that is coupled to the memory device 3. The memory system 1 may be a host device or a system-on-chip. The NVM device includes an array 5 of memory cells and a circuitry located around the memory array, as described in more detail below. The memory cells are the fundamental building block of computer memory. The memory cells are electronic circuits that store one bit of binary information (binary digit), and they are set to store a logic 1 (e.g., high voltage or current level) and reset to store a logic 0 (e.g., low voltage or current level). Their value is maintained/stored until changed by the set/reset process. The value in the respective memory cell can be accessed by reading it.

The coupling between the memory system 1 and the memory device 3 is in this example obtained by interconnecting a plurality of respective pads or pin terminals that are faced one towards the other in a circuit layout that keeps the alignment of the pads even if the size of the memory device is modified.

In this example, the memory device 3 further comprises an input/output (I/O) circuit 7, a micro sequencer 9, voltage and current reference generators 11, charge pumps 13, a decoding circuitry 15 located at the array periphery or below the array 5, sense amplifiers 17, and a command user interface 19.

Figure 2:
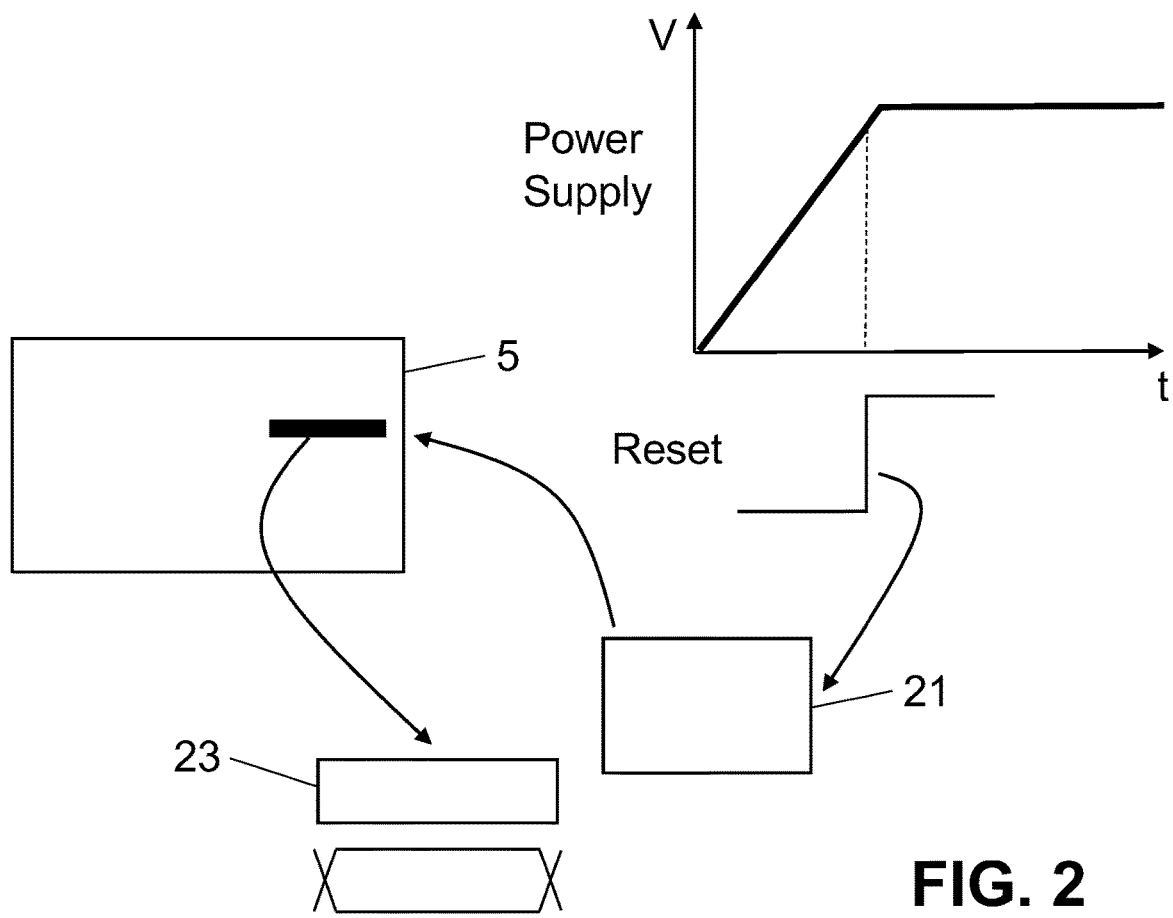
FIG. 2 schematically illustrates the process of reading data from a memory array of the memory system of FIG. 1.

FIG. 2 illustrates the power-on process of the memory device 3. Upon powering on the memory device 3, the supply voltage is increased, and as soon as it reaches a given value, it triggers a reset signal to enable a circuitry 21 to perform a read operation in a specific area or part of the memory array 5 in the memory device 3. The output data from the memory device 3 may be stored in a register 23 or a random-access memory. The circuitry 21 and/or the register 23 may or may not be part of the memory system 1.

It is to be noted that the read operation of sensible data may be executed when the power is on, and not to be executed only after power-on.

The present invention is based on the concept according to which for every sensible data bit at least two memory cells in the memory array 5 are used to store the required information. In the following example, the sensible data are trimming bits, but the sensible data could instead be other type of data. More specifically, as explained below in more detail, in this example, every trimming bit should be written in two memory cells as "1" and "0" (in a complimentary manner), or alternatively "0" and "1". In other words, trimming bit "0" is equal to writing bit value (i.e., logic state) "1" in a first memory cell, and bit value "0" in a second memory cell, while trimming bit "1" is equal to bit value "0" in the first memory cell, and bit value "1" in the second memory cell (first convention). Alternatively, an inverted, second convention could be used instead, according to which trimming bit "1" is equal to writing bit value "1" in the first memory cell, and bit value "0" in the second memory cell, while trimming bit "0" is equal to bit value "0" in the first memory cell, and bit value "1" in the second memory cell. A reference value is then used to read the bit values stored in the memory cells. The reference value represents an electrical property, which in the present example is an electric current value (Iref), but it could instead be a voltage value, a resistance value or any other suitable value. It is to be noted that more than two memory cells could be used as an extension of the present invention to store one bit of sensible data.

Figure 3:
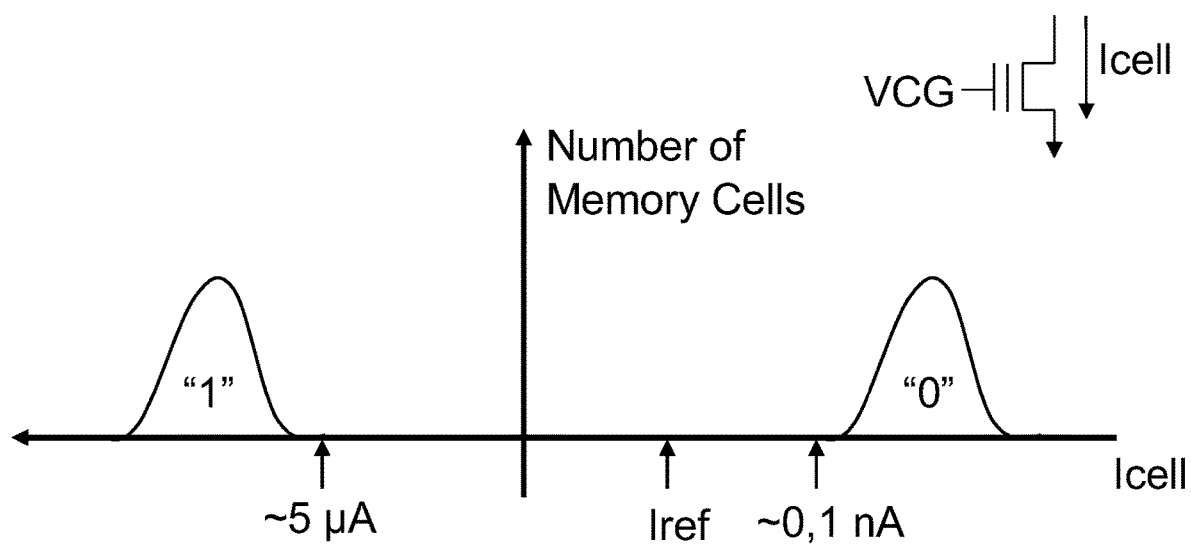
FIG. 3 shows current probability distributions for logic states "1" and "0" of memory cells of the memory array shown in FIGS. 1 and 2.

A large number of memory cells are present in the memory array 5. A probability distribution of memory cell electrical parameters or properties represents the non-ideal behaviour of the memory cells as depicted in FIG. 3. More specifically, the logic state of the memory cell can be derived from the value of this electrical property, which in the present example is electric current though the respective memory cell. For each logic state ("0" and "1), a Gaussian or normal distribution of electric current through the memory cell (Icell) is depicted as shown in FIG. 3. In this example, the memory cell is formed by a transistor, and in particular a metal-oxide-semiconductor field-effect transistor. As any given transistor slightly differs from other transistors, also the currents (in any given logic state) through the transistor are slightly different. This leads to the depicted current distributions as shown in FIG. 3.

When memory cells are written, a conventional "0" is used and when these are erased, "1" is used. In FIG. 3, two distributions of memory cell currents are shown. To read the content of a memory cell, in other words to read if the logic state "0" or "1", a reference current Iref is used in this example. This reference current should be placed between these two distributions along the axis defined by the electrical property (which is electric current in this example), but not necessarily in the middle of the space between these distributions, in order to distinguish correctly and reliably the memory cell content (bit "0" or "1"). Here a respective distribution can be defined by substantially non-zero probability values between two probability values that are substantially zero (or between two probability values close to zero that exceed a given probability threshold value). More specifically, in this example, the memory cell current is compared to the reference current, and if the memory cell current is equal to or greater than the reference current, then the memory cell is determined to store a bit value of 1, while if the memory cell current is smaller than the reference current, then the memory cell is determined to store a bit value of 0. More broadly, any appropriate electrical property of the memory cell can be compared to the reference value, if this comparison leads to a first relationship, then the memory cell is determined to store a first bit value, while if this this comparison leads to a second, different relationship, then the memory cell is determined to store a second, different bit value.

Figure 4:
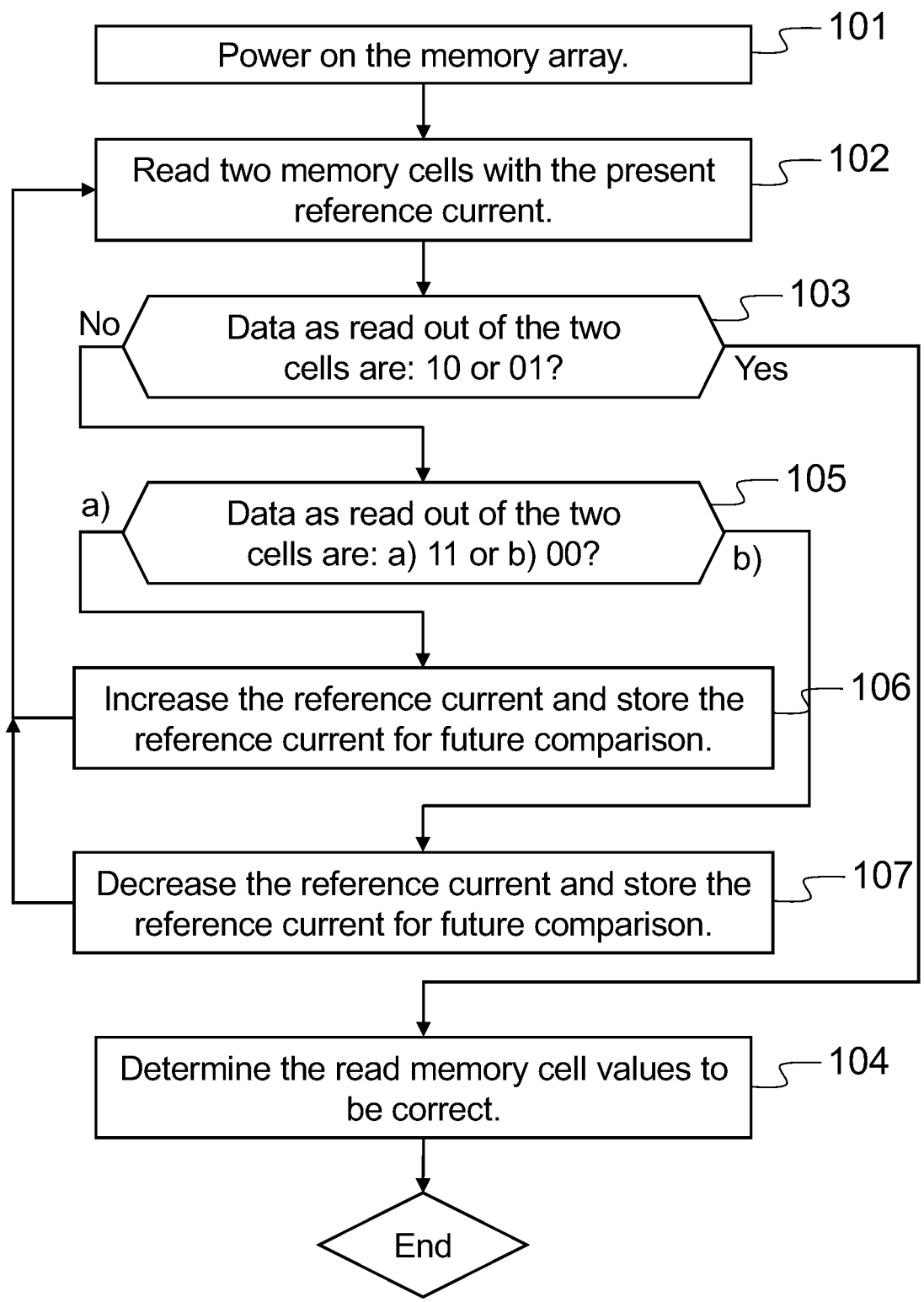
FIG. 4 is a flow chart summarising the method steps of the process of reading data from a non-volatile memory array.

The proposed process is next explained with reference to the flow chart of FIG. 4. In step 101, electric power is applied to the memory array 5, i.e., it is powered on. In step 102, a given area of two memory cells storing sensible data in the memory array is read by using the currently stored reference current. In this case, since the memory array has just been powered on, the reference current is the default reference current stored in the memory system 1. The memory cells may be read simultaneously or sequentially, one after the other. In step 103, it is determined whether or not the data as read from these two memory cells are 01 or 10. If this is the case then in step 104, it is determined that the data are correctly read from the two memory cells, and the value of the sensible bit can be determined based on the bit combination read from the first and second memory cells. The value of the sensible bit may then be used for subsequent data processing.

Figure 5:
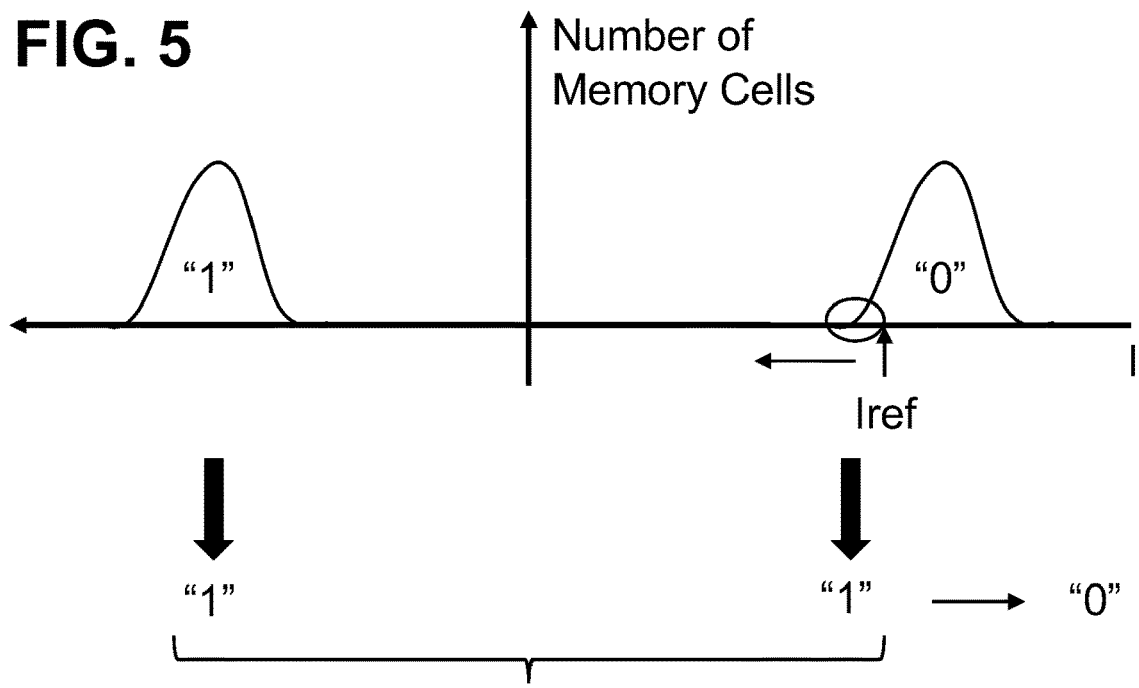
FIGS. 5 and 6 highlight the problem of using a suboptimal reference current value when reading data from memory cells, and how this may lead to incorrect readings from these memory cells.

If on the other hand it was determined in step 103 that the data from the two memory cells are not 01 or 10, then the process continues in step 105. If in step 105 it is determined that the data in the two memory cells are 11, then the process continues in step 106, where the reference current is moved to the left, in other words the value of the reference current is increased. The reference current is thus adjusted or updated so that its value lies in the space between the two current distributions. FIG. 5 illustrates the scenario where bit combination 11 is incorrectly read from the two memory cells due to the sub-optimal (i.e., in this case too low) reference current value. In this step, the reference current as adjusted is also stored in the memory system so that it may be used for future comparisons in step 102.

Figure 6:
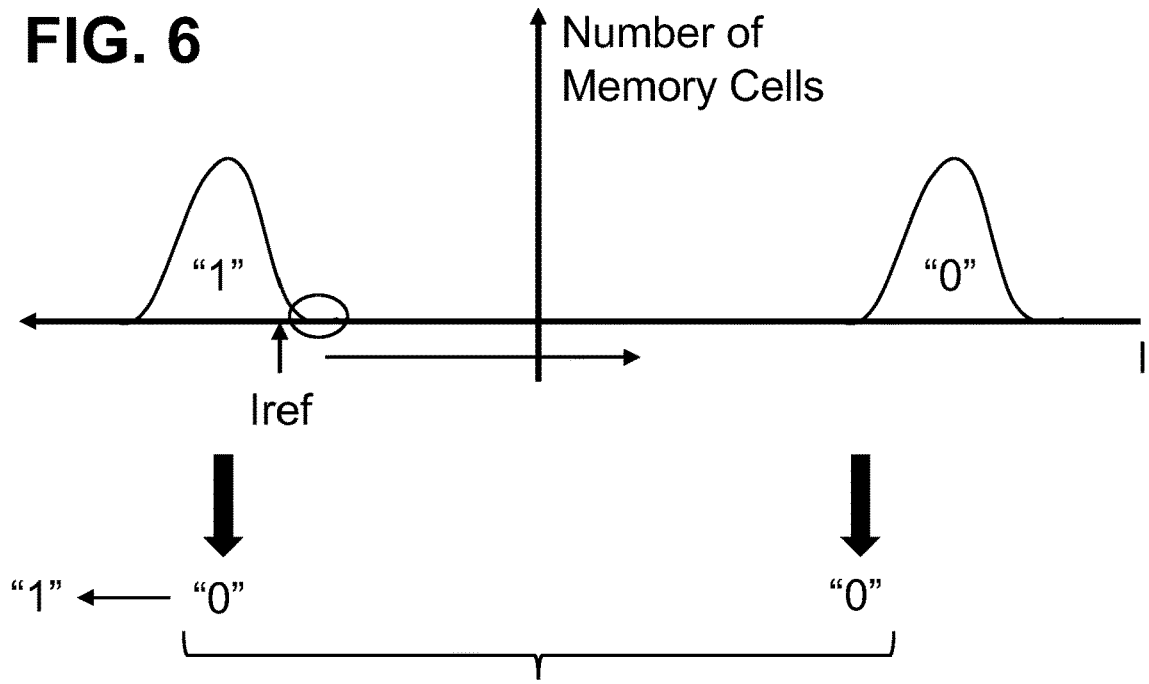

If in step 105 it is determined that the data in the two memory cells are 00, then the process continues in step 107, where the reference current is moved to the right, in other words the value of the reference current is decreased. The reference current is thus adjusted so that its value lies in the space between the two current distributions. FIG. 6 illustrates the scenario where bit combination 00 is incorrectly read from the two memory cells due to the sub-optimal (i.e., in this case too high) reference current value. In this step, the reference current as adjusted is also stored in the memory system so that it may be used for future comparisons in step 102.

Based on the above, in the above example, the reference value is increased, if the reference value overlaps the distribution corresponding to logic state 0, and the reference value is decreased, if the reference value overlaps the distribution corresponding to logic state 1. In other words, if the reference value spatially coincides with the location of the distribution of logic state 0 in the spatial domain defined by the electrical property (which is the electric current in the above example), then the reference value is increased, while if the reference value spatially coincides with the location of the distribution of logic state 1 in the spatial domain defined by the electrical property, then the reference value is decreased.

From steps 106 and 107, the process continues in step 102, where the same two memory cells are again read. The above-described process is thus repeated until the data as read from these two memory cells are either 01 or 10, in this example. In other words, the accepted bit combination is the one where each logic state is present at least once. The unaccepted bit combination is the one, where only bit values corresponding to a single logic state are present. The reference current is thus in this example repeatedly adjusted until the data from the two memory cells can be correctly read. The size of the adjustment step of the reference current is in this example kept constant, but it could instead be non-constant during the adjustment process. For example, first adjustments could be done with a greater adjustment step than the subsequent adjustments. Furthermore, the user may select the size of the adjustment step, or a default adjustment step size may be used.

The memory array 5 may be arranged so that only logic states of sensible data (i.e., sensible data bits) are written so that they occupy at least two memory cells in the memory array 5, while logic states of other data are written so that they occupy only one memory cell in the memory array 5. In this manner the benefits of the present invention can be fully achieved, but the size of the memory array can be kept small.

The method steps described above may be carried out by suitable circuits or circuitry when the process is implemented in hardware or using hardware for individual steps. However, the method or at least some of the method steps may also or instead be implemented in software. Thus, at least some of the method steps can be considered as computer-implemented steps. The terms "circuits" and "circuitry" refer to physical electronic components or modules (e.g., hardware), and any software and/or firmware ("code") that may configure the hardware, be executed by the hardware, and or otherwise be associated with the hardware. The circuits may thus be operable (i.e., configured) to carry out or they comprise means for carrying out the required method steps as described above.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims. Further variants may be obtained by combining any of the above teachings. Furthermore, the above embodiment was explained in the context of binary-valued logic, but the teachings of the present invention are also applicable to multiple-valued logic systems using more than two distinct logic states.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A method for reading data from a non-volatile memory array comprising a plurality of memory cells, a respective memory cell being configured to store one logic state of digital information, the method comprising the steps of:
   powering on the memory array, where information stored in at least a respective first memory cell and a respective second memory cell together corresponds to one logic state of sensible data;
   reading at least a respective first memory cell value from the respective first memory cell and a respective second memory cell value from the respective second memory cell by comparing a reference value to a respective electrical property value of the respective memory cell to determine the respective memory cell value, the respective electrical property value being associated with a logic state value stored in the respective memory cell;
   adjusting the reference value in an event that at least the respective first and second memory cell values have a first combination of logic state values to obtain an adjusted reference value, wherein the adjusted reference value lies in a space between a first distribution of possible electrical property values for the respective first memory cell value, and a second distribution of possible electrical property values for the respective second memory cell value;

reading at least the respective first memory cell value from the respective first memory cell and the respective second memory cell value from the respective second memory cell by using the adjusted reference value to obtain a second combination of logic state values different from the first combination of logic state values; and determining a logic state value of sensible data read from the memory array based on the obtained second combination of logic state values.

2. The method according to claim 1, wherein the reference value is an electric current value and the first and second distributions are electric current distributions, or wherein the reference value is a voltage value and the first and second distributions are voltage distributions.

3. The method according to claim 1, wherein the first combination of logic state values comprises a combination of logic state values 0 and 1, and wherein the second combination of logic state values comprises a combination of the same logic state values.

4. The method according to claim 3, wherein the respective first and second memory cell values are read substantially simultaneously.

5. The method according to claim 1, wherein the reference value is adjusted repeatedly until the adjusted reference value lies in the space between the first and second distributions.

6. The method according to claim 5, wherein the reference value is adjusted by using non-constant adjustment step values.

7. The method according to claim 1, wherein the reference value is increased, if the reference value overlaps the distribution corresponding to logic state 0, and the reference value is decreased, if the reference value overlaps the distribution corresponding to logic state 1, or vice versa.

8. The method according to claim 1, wherein the first combination of logic state values is a pre-defined set of values for acceptable logic state combinations for the respective first and second memory cells.

9. The method according to claim 1, wherein the memory cell is a transistor, and/or wherein the logic state value of sensible data is previously unknown.

10. The method according to claim 1, wherein the sensible data are trimming data.

11. The method according to claim 1, wherein the respective first and second memory cells are located in a dedicated, predefined area in the memory array.

12. The method according to claim 1, wherein the logic state value of sensible data is determined without using an error correction code.

13. The method according to claim 1, wherein information from at least three memory cells is collectively associated with one logic state value of sensible data, and the method comprising further reading a respective third memory cell value from a respective third memory cell, and wherein the adjusted reference value lies in the space between the first distribution, the second distribution, and a third distribution of possible electrical property values for the respective third memory cell value.

14. The method according to claim 1, wherein the read operation of sensible data is executed when the power is on, and not to be executed only after power-on.

15. A memory system for reading data from a non-volatile memory array comprising a plurality of memory cells, a respective memory cell being configured to store one logic state of digital information, the memory system comprising a device for:

powering on the memory array, where information stored in at least a respective first memory cell and a respective second memory cell corresponds to one logic state of sensible data;

reading at least a respective first memory cell value from the respective first memory cell and a respective second memory cell value from the respective second memory cell by comparing a reference value to a respective electrical property value of the respective memory cell to determine the respective memory cell value, the respective electrical property value being associated with a logic state value stored in the respective memory cell;

adjusting the reference value in an event that at least the respective first and second memory cell values have a first combination of logic state values to obtain an adjusted reference value, wherein the adjusted reference value lies in a space between a first distribution of possible electrical property values for the respective first memory cell value, and a second distribution of possible electrical property values for the respective second memory cell value;

reading at least the respective first memory cell value from the respective first memory cell and the respective second memory cell value from the respective second memory cell by using the adjusted reference value to obtain a second combination of logic state values different from the first combination of logic state values; and determining a logic state value of sensible data read from the memory array based on the obtained second combination of logic state values.

16. The system according to claim 15, wherein only logic states of sensible data are written so that they occupy at least two memory cells in the memory array, while logic states of other data are written so that they occupy only one memory cell in the memory array.

* * * * *